MULTIFREQUENCY GENERATOR HAVING PHASE LOCK AND AUTOMATIC FREQUENCY CONTROL

Filed Dec. 29, 1961 2 Sheets-Sheet 1

INVENTORS W. KAMINSKI
H. A. SCHNEIDER
BY [signature]
ATTORNEY

MULTIFREQUENCY GENERATOR HAVING PHASE LOCK AND AUTOMATIC FREQUENCY CONTROL

Filed Dec. 29, 1961 2 Sheets-Sheet 2

INVENTORS W. KAMINSKI
H. A. SCHNEIDER
BY [signature]
ATTORNEY

United States Patent Office 3,202,936 Patented Aug. 24, 1965

3,202,936

MULTIFREQUENCY GENERATOR HAVING PHASE LOCK AND AUTOMATIC FREQUENCY CONTROL

William Kaminski, West Portal, and Herbert A. Schneider, Millington, N.J., assignors to Bell Telephone Laboratories, Incorporated, New York, N.Y., a corporation of New York Filed Dec. 29, 1961, Ser. No. 163,346
3 Claims. (Cl. 331—11)

Figure 1:
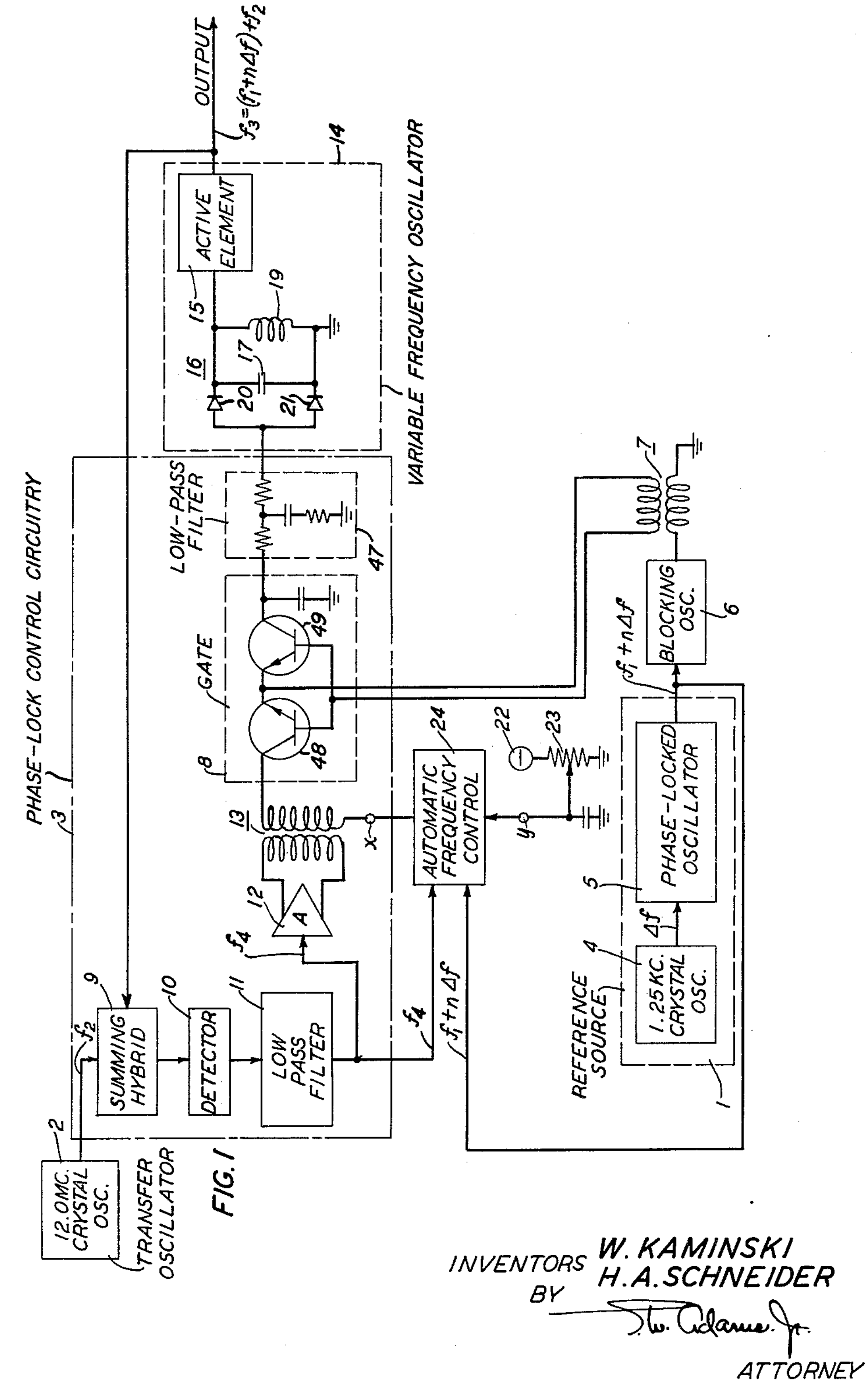

This invention relates to multifrequency generators and more particularly to frequency stabilization of multifrequency generators.

There are many ways of producing a plurality of frequencies to be employed in particular applications. For example, the output of two frequency generators may be beat together to produce a plurality of frequencies by frequency addition or subtraction, or the output of a single frequency oscillator may be split up and then increased or decreased in different multiples by frequency multiplication or division and the resultant frequencies combined by frequency synthesis. In any of the processes involving frequency addition or subtraction or synthesis, it has been found that a phase-locked oscillator may be used to particular advantage as a sharp filter as well as a basic multifrequency generator.

One advantageous multiple frequency generator employs both frequency addition and phase-locked oscillators as suggested above to attain highly precise control of both the absolute frequency of individual output frequencies and the spacing between available frequencies. This generator utilizes a phase-locked oscillator as the primary source of the plural signals of controlled and related frequencies together with a second phase-locked oscillator and a crystal oscillator, which serves as a source of a so-called transfer frequency, to perform the frequency addition operation. The three oscillators cooperate so that the second phase-locked oscillator will operate in a frequency range determined in extent by the first or primary oscillator and in frequency by the transfer oscillator.

The primary oscillator may, for example, be of the kind disclosed in our copending application for "Multifrequency Generators," Serial No. 163,345, filed December 29, 1961, in which the control loop of a phase-locked oscillator includes frequency determining elements which may be mechanically switched in circuit to select a particular one of a number of harmonically related output frequencies which are linearly related and have equal tuning ranges over which phase-lock operation occurs.

Typically, phase-locked oscillators are controlled by a comparison gate which serves in the phase-lock loop to compare a reference signal (here a pulse from the primary source) and a sinusoidal signal derived at least in part (if a transfer oscillator is used) or entirely from the output of the oscillator under phase-lock control.

Once the oscillator under phase-lock control is synchronized to the reference signal, it provides excellent filtering and a well-controlled frequency hold range over which lock is maintained. However, if the channels, as determined by the output of the first phase-locked oscillator or reference source, are switched so that the phase loop of the second phase-locked oscillator is disturbed temporarily, the pull-in range characteristics of this oscillator come into play. This pull-in range, or as it is sometimes called, "capture range," is primarily determined by the pass-band of the component elements in the phase-lock loop; while the hold range, or as it is sometimes called, "lock range," is dependent upon the range of the comparison gate or phase detector and the range of the tuning elements that are responsive to the phase-lock loop. Usually, this pull-in range is smaller than the hold range, especially when the sinusodial type of phase discriminator is employed in the second phase-locked oscillator. Consequently, the coarse tuning elements of the oscillator must be sufficiently stable and accurate to provide an unlocked or nominal frequency close enough to the locked frequency so that the pull-in range is not exceeded.

In the past, different methods have been employed to cause the second phase-locked oscillator to lock on the newly selected frequency even though the pull-in range was not sufficient. A typical example is found in circuits in which a sweeping voltage is applied to force the phase-locked oscillator to pass slowly through the desired frequency at some point of its excursion. Another method is to employ external circuits in an attempt to increase the pull-in range.

It is to be noted that the methods employed in the past are inherently either effective only over relatively narrow frequency bands, slow-acting, or are temperature dependent and harmonic and amplitude-sensitive. Additionally, these methods are generally insensitive to false lock conditions, that is, the locking on an unwanted harmonic or channel of the reference signal by the phase-locked oscillator.

Therefore, it is an object of this invention to effectively extend the pull-in range of a phase-locked oscillator without being limited by the frequency of operation.

It is additionally an object of this invention to effectively extend the pull-in range of a phase-locked oscillator by broadband external means.

A further object of this invention is to extend this range over a broad band of frequencies by means that are insensitive to temperature changes and to the harmonic content and amplitude variations of the reference and phase-loop signals.

Another object is to eliminate the possibility of false lock in the phase-locked oscillator.

In accordance with the invention, therefore, an automatic frequency control loop is used in conjunction with a phase-locked oscillator having a frequency range determined by a reference signal from a first source and operating at a frequency determined by a second source. The automatic frequency control loop comprises a symmetrical frequency discriminator having two identical channels so that it is insensitive to temperature changes. The frequency of the output signal from the first source and a signal that has a frequency that is derived by mixing the outputs from the phase-locked oscillator and from the second source are compared in the frequency discriminator. The output of the automatic frequency control loop is applied to the frequency determining circuit of the phase-locked oscillator, thereafter permitting the phase-lock loop to control the output signal. The comparison of the two signals in the frequency discriminator effectively eliminates the possibility of locking on an unwanted frequency. Each channel employs means for effectively eliminating the harmonics and the amplitude variations from the input signals.

Figure 2:
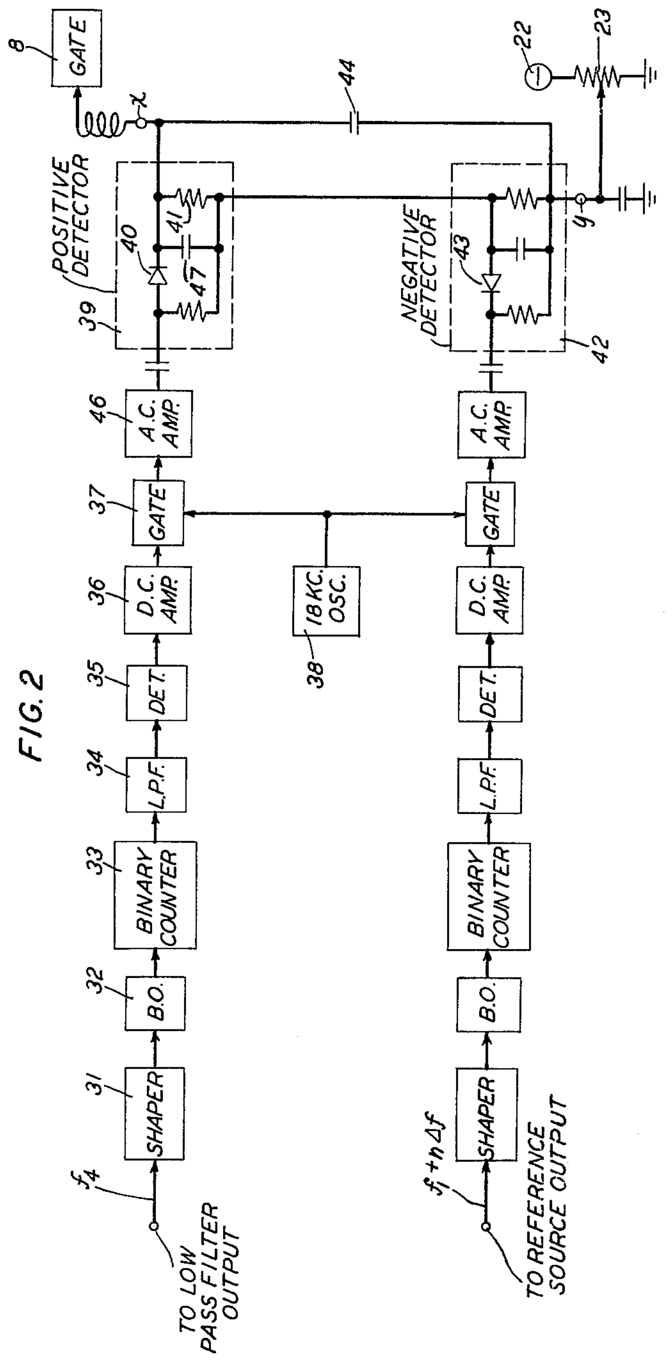

These and other features of the invention will appear more clearly and fully upon consideration of the following specification taken in connection with the drawing in which:

FIG. 1 is a schematic diagram, partially in block form, of a multifrequency generator employing frequency addition and incorporating an automatic frequency control circuit according to the invention; and FIG. 2 is a schematic diagram, partially in block form, of a frequency discriminator suitable for use in accordance with the invention in the automatic frequency control circuit of FIG. 1.

A typical multifrequency generator, herein a frequency adder, incorporating automatic frequency control according to the invention, is shown in FIG. 1. This frequency adder comprises a reference source 1 having a frequency output of $f_1+n\Delta f$, a transfer oscillator 2 having a frequency output of $f_2$, and a first phase-locked oscillator 14 having a frequency output of $f_3$.

The reference source 1 comprises a crystal oscillator 4, which determines the frequency spacing between the output frequencies of the reference source, and a phase-locked oscillator 5, which acts as a filter to select the desired harmonic from the output of oscillator 4, thereby determining the frequency range of the reference signal.

For illustrative purposes, the output frequency of reference source 1 may be, for example, from 25 kilocycles to 50 kilocycles in 20 equal steps $\Delta f$ of 1.25 kilocycles, the step size being determined by the frequency of crystal oscillator 4. The output frequency of transfer oscillator 2 may be 12 megacycles, for example, and the output frequency of phase-locked oscillator 14 will thereafter be at a frequency from 12.025 megacycles to 12.050 megacycles, depending upon the channel $n$ selected from the reference source 1.

The output of reference source 1 passes through a blocking oscillator 6, where it is changed into a series of pulses. These pulses are thereafter applied through a transformer 7 to a phase-sampling gate 8, which forms a part of phase-lock control circuitry 3, as the gate control signal. Reference should be made to Patent No. 2,889,570, issued August 11, 1959, to J. D. Johannesen, P. B. Meyers, and J. E. Schwenker, assigned to the assignee of this application, for elaboration of the details of operation of gate 8. As described fully in Patent 2,899,570, during intervals of time in which no pulses are applied to gate 8 through transformer 7, a high impedance exists between the collectors of transistors 48 and 49. In this state gate 8 blocks transmission of bias voltage. During intervals of time in which pulses are applied to gate 8 through transformer 7, the emitter-to-base circuits of transistors 48 and 49 become forward biased, creating a low impedance state between the collectors of these transistors. In this state gate 8 transmits bias voltage.

The output of phase-locked oscillator 14, which will be described in detail hereafter, is combined in a summing hybrid 9 with the output from transfer oscillator 2, thereby producing an output that is a combination of the frequencies $f_2$ and $f_3$. This combined signal is thereafter coupled into a detector 10, wherein the difference frequency $f_4$ is produced. This difference frequency is approximately equal to the output frequency of reference source 1, and it is exactly equal to it when phase-locked oscillator 14 is locked on the selected frequency. This signal is then applied to a low-pass filter 11, which could also be a band-pass filter, wherein the signal of frequency $f_4$ is selected. The output of low-pass filter 11 is fed through an amplifier 12 and appears as a sine wave across the primary winding of a transformer 13. This sinusoidal signal is then applied through transformer 13 to gate 8, which acts as a phase sampler or detector, thereby supplying through a low-pass filter 47 the correction voltage for the tuning elements of variable frequency oscillator 14.

As shown in FIG. 1, phase-lock control circuitry 3 controlling variable frequency oscillator 14 includes a phase-lock control loop in which a portion of the output of oscillator 14 is applied in order to permit stabilization or synchronization of the oscillator. This loop includes summing hybrid 9, detector 10, low-pass filter 11, and amplifier 12 to which reference has already been made.

Variable frequency oscillator 14 comprises an active element 15, such as a transistor or vacuum tube amplifier, shown in block form, and a frequency determining circuit 16 comprising the parallel combination of a capacitor 17 and an inductor 19 and a tuning network comprising varactors 20 and 21 connected across the parallel combination. Variable frequency oscillator 14 is therefore tuned through its entire range by variation of the capacitance of these varactors 20 and 21 responsive to changes of direct-curent bias applied thereto.

The varator bias comprises a fixed component that is constant throughout the frequency range of operation and a variable component that varies in accordance with the phase difference between the signal in the phase-lock loop and the reference signal from source 1. The fixed component is supplied from a source 22 through a potentiometer 23, which may be adjusted to select the proper fixed bias. The variable component is supplied by the signal fed back from oscillator 14 through the phase-lock loop discussed above.

The operation of the frequency adder will be herein described by using the specific frequencies, which are to be in no way limiting, but only illustrative. For purposes of illustration, it will be assumed that phase-locked oscillator 14 is to be set up near the midpoint of operation and, for the case herein described, this will occur at approximately 12.0375 megacycles.

Phase sampling gate 8 of phase-lock control circuitry 3 normally has the above-described fixed bias supply connected to its input terminal $x$. The potential of this supply will be passed by gate 8 and applied to varactors 20 and 21 to initially bias the varactors for operation at this selected midpoint frequency.

When a different frequency of operation is desired, the phase-locked oscillator 5 of reference source 1 will be tuned. This tuning may be accomplished by mechanically varying the inverse inductane and inverse capacitance of the phase-locked oscillator similar to the tuning of the phase-locked oscillator described in our above-identified copending application. The bias on varactors 20 and 21 of phase-locked oscillator 3 will thereafter have to change to tune variable frequency oscillator 14 to the newly selected frequency. If a higher frequency is selected, the capacitance of varactors 20 and 21 will have to decrease, while for a lower frequency the capacitance will have to increase. Therefore, it is seen that the variable components of bias applied to varactors 20 and 21 as a result of phase detection of signal $f_4$ appearing across transformer 13 and the pulse signal appearing across transformer 7 will have to be bipolar to provide for both possibilities.

Since the input signal to gate 8 from the phase loop is sinusoidal, it is clearly desirable to select the initial fixed bias to cause oscillator 14 to operate at the midfrequency of the band of operation. Thus, the phase sampling of the output of oscillator 14 when operating at the midfrequency of the band of operation is permitted to take place at its zero crossing. This allows the greatest phase margin possible at the other frequencies when the sine wave is sampled to supply the variable component of bias.

Due to the finite range over which the phase-lock control circuitry 3 will be able to lock oscillator 14 on a newly selected frequency, it is desirable to effectively extend this range so that lock may occur at least in the range over which the oscillator will remain in lock. As is well known in the art, extending the capture range of a phase-locked oscillator by changing the internal circuitry has an adverse effect on the signal-to-noise requirement therein. Therefore, it is desirable to extend this range by another method. According to the present invention, an automatic frequency control circuit 24 is employed. This circuit is connected in the bias circuit of the varactors 20 and 21 between the fixed bias supply connected to terminal $y$ and the input to gate 8 at terminal $x$.

The automatic frequency control circuit 24 will be discussed in detail with reference to FIG. 2. It is there seen that the control circuit comprises two channels which are identical so that the resulting symmetry compensates for any temperature changes in the circuit. The first channel has an input from low-pass filter 11 (FIG.1) which represents the signal in the phase-lock loop of phase-locked oscillator 14. This signal, at a frequency $f_4$, which is approximately equal to the output frequency of reference source 1, is applied to a shaper 31, preparatory to application to blocking oscillator 32. The shaper signal is thereafter applied to a blocking oscillator 32, which changes the input signal to a pulse. The combination of the shaper 31 and blocking oscillator 32 provides a pulse shape, constant in width and amplitude and independent of frequency, amplitude or harmonic content of the driving signal.

This pulse is thereafter applied to a binary counter 33, which may be a flip-flop with steering logic, for example. Binary counter 33 provides a signal of well-regulated amplitude and having a large fundamental component at the half frequency of the input signal. This signal, which has a constant harmonic and phase content due to the equal ON-OFF period of the counter 33, is applied to a low-pass filter 34, having a cutoff below the lowest frequency of interest, thereby acting as a frequency to voltage transducer whose output magnitude indicates the frequency being examined.

The output of low-pass filter 34 is applied to a peak detector 35, where it is converted to a direct-current signal. This direct-current signal is then applied to a direct-current amplifier 36. The output of the amplifier 36 is sampled by a gate 37 at a rate determined by an oscillator 38. The sampled output from detector 35 is thereby changed to an alternating-current signal by gate 37. This alternating-current signal is then amplified by an alternating-current amplifier 46, which may be, for example, a resonant transformer. The gain of the automatic frequency control loop may be advantageously controlled by controlling the gain of alternating-current amplifier 46.

The output of amplifier 46 is applied to a peak detector 39, which includes a nonlinear rectifying element 40. The direct-current output of this first channel appears across a resistor 41 and a capacitor 47 of detector 39 and is representative of the input frequency.

The second channel is similarly constructed. Its input signal is derived from the output of reference source 1 (FIG. 1) and at all times is representative of the selected frequency of operation. The essential difference between the two channels is in detector 42, wherein it is seen that a nonlinear rectifying element 43 is poled in opposition to the rectifying element 40 in detector 39. Detector 42 will now have an output that is of the opposite polarity from the output of detector 39. Therefore, if the frequencies applied to the two channels are exactly equal, there will be no voltage appearing at the output of the frequency control circuit. The output voltage will appear across the summing circuit comprising the two peak detectors 39 and 42, which are shunted by a capacitor 44 that bypasses radio-frequency signals.

Whenever a new frequency of operation is selected by changing the output frequency of reference source 1 (FIG. 1), the frequency control circuit 24 (shown in detail in FIG. 2) will have an output proportional to the frequency difference between the old frequency and the new frequency. This frequency control circuit will supply a bias of the correct polarity to varactors 20 and 21 so that the phase-locked oscillator 14 will be approximately tuned to the desired frequency. The phase-lock control circuitry 3 for oscillator 14 will thereafter take over and bring the operating frequency of oscillator 14 exactly in step with the desired frequency, whereupon the automatic frequency control loop becomes inactive and all lock or hold controls are exercised by the phase control loop.

It is to be noted that by monitoring the proper points in the multifrequency generator of FIG. 1, it is possible to determine if the circuits are operating properly. For example, a simple direct-current voltage-sensitive monitor could be connected across the output of the automatic frequency control circuit to determine whether it is functioning properly.

It is sometimes possible for the phase loop to lock on another channel or frequency rather than the desired one. Such a condition cannot be tolerated. Since the automatic frequency control loop monitors both frequencies, it would have an output because of the different input frequencies. The automatic frequency control will generate a correction voltage of the correct polarity, and because the gain in the automatic frequency control loop is considerably greater than that of the phase-lock loop, it will override the phase-lock loop hold characteristics, thereby pulling the frequency out of the "spurious" lock and forcing oscillator 14 toward its correct frequency. Thereafter, the phase-lock loop again takes over and locks to the correct frequency.

What is claimed is:

1. In combination, a multifrequency generator capable of selectively producing a plurality of frequencies, an oscillator the frequency of operation of which is responsive to applied voltages, and means for establishing and maintaining a predetermined relationship between the phase of the output of said oscillator and the selected signal of said multifrequency generator comprising a phase detector to which a signal representative of the selected signal of said multifrequency generator and a signal representative of the output of said oscillator are applied, said phase detector producing a voltage related to the phase difference between the applied signals, a frequency detector to which a signal representative of the selected signal of said multifrequency generator and a signal representative of the output of said oscillator are applied, said frequency detector producing an output voltage related to the frequency difference between the applied signals for all frequencies within the range of said multifrequency generator, and means for applying the voltage produced by said phase detector and the voltage produced by said frequency detector to said oscillator to establish and maintain said predetermined relationship.

2. In combination, a multifrequency generator capable of producing any one of a plurality of frequencies, an oscillator the frequency of operation of which is responsive to applied voltages, and means for establishing and maintaining a predetermined relationship between the phase of the output of said oscillator and the selected signal of said multifrequency generator comprising a phase detector to which a signal representative of the selected signal of said multifrequency generator and a signal representative of the output of said oscillator are applied, said phase detector producing a voltage related to the phase difference between the applied signals, an automatic frequency control circuit comprising two identical channels, a signal representative of the selected signal of said multifrequency generator being applied to one of said channels and a signal representative of the output of said oscillator being applied to the other of said channels, each of said channels comprising a frequency sensitive network producing a voltage related to the frequency of the signal applied to the channel, and means for combining the voltages from each of said channels such that the resultant is proportional to the frequency difference between the signals applied to said two channels, and means for applying the voltage produced by said phase detector and the resultant voltage produced by said automatic frequency control circuit to said oscillator to establish and maintain said predetermined relationship.

3. Apparatus comprising a multifrequency generator capable of producing any one of a plurality of frequencies within a given frequency band, a first oscillator, a second oscillator to be phase locked to a given beat component of the output from said first oscillator and the output from said multifrequency generator, the frequency of said second oscillator being controllable by a voltage applied to a frequency control element thereof, a mixer to which is applied the output from said first oscillator and the output from said second oscillator, a phase detector to which is applied the output of said multifrequency generator and the component of said mixer oscillating nearest to the frequency of the output of said multifrequency generator, said phase detector producing a voltage proportional to the phase difference between the applied signals, an automatic frequency control circuit comprising two identical channels, the component of said mixer oscillating nearest to the frequency of the output of said multifrequency generator being applied to one of said channels and the output of said multi-frequency generator being applied to the other of said channels, each of said channels comprising a frequency selective network producing a voltage related to the frequency of the signal applied to the channel, and means for combining the voltages from each of said channels such that the resultant is proportional to the frequency difference between the signals applied to said channels, means for combining the voltage produced by said phase detector and the resultant voltage produced by said automatic frequency control circuit, and means for applying the last-named combined voltage to said frequency control element to lock the phase of said second oscillator to said given beat component.

References Cited by the Examiner

UNITED STATES PATENTS

| | | | |
|---|---|---|---|
| 2,610,297 | 9/52 | Leed | 331—11 |
| 3,023,370 | 2/62 | Waller | 331—11 |
| 3,047,809 | 7/62 | Bergman | 331—12 |
| 3,101,448 | 8/63 | Costas | 331—12 |

ROY LAKE, *Primary Examiner.*

JOHN KOMINSKI, *Examiner.*